(12) United States Patent
Yuen

(10) Patent No.: US 10,630,048 B2
(45) Date of Patent: Apr. 21, 2020

(54) ELECTRICALLY ISOLATING ADJACENT VERTICAL-EMITTING DEVICES

(71) Applicant: Lumentum Operations LLC, Milpitas, CA (US)

(72) Inventor: Albert Yuen, Milpitas, CA (US)

(73) Assignee: Lumentum Operations LLC, Milpitas, CA (US)

(*) Notice: Subject to any disclaimer, the term of this patent is extended or adjusted under 35 U.S.C. 154(b) by 0 days.

(21) Appl. No.: 16/266,926

(22) Filed: Feb. 4, 2019

(65) Prior Publication Data
US 2019/0181609 A1    Jun. 13, 2019

Related U.S. Application Data

(63) Continuation of application No. 15/893,068, filed on Feb. 9, 2018, now Pat. No. 10,199,794.

(60) Provisional application No. 62/561,009, filed on Sep. 20, 2017.

(51) Int. Cl.
*H01S 5/00* (2006.01)
*H01S 5/02* (2006.01)
(Continued)

(52) U.S. Cl.
CPC .............. *H01S 5/0218* (2013.01); *H01S 5/00* (2013.01); *H01S 5/02* (2013.01); *H01S 5/0425* (2013.01); *H01S 5/125* (2013.01); *H01S 5/183* (2013.01); *H01S 5/1833* (2013.01); *H01S 5/34346* (2013.01); *H01S 5/42* (2013.01); *H01S 5/0208* (2013.01); *H01S 5/02276* (2013.01); *H01S 5/18313* (2013.01); *H01S 5/2063* (2013.01);
(Continued)

(58) Field of Classification Search
CPC .......... H01S 5/423; H01S 5/125; H01S 5/183; H01S 5/0218; H01S 5/323; H01S 5/343; H01S 5/34346; H01S 2301/173
See application file for complete search history.

(56) References Cited

U.S. PATENT DOCUMENTS 6,069,908 A * 5/2000 Yuen .................. H01S 5/183
                                                           372/50.124
6,257,739 B1 * 7/2001 Sun .................... H01S 5/02252
                                                           257/E27.12
(Continued)

FOREIGN PATENT DOCUMENTS

CN      102136677 A     7/2011
CN      103403986 A    11/2013

*Primary Examiner* — Kinam Park
(74) *Attorney, Agent, or Firm* — Harrity & Harrity, LLP

(57) ABSTRACT

A vertical cavity surface emitting laser (VCSEL) array may comprise a doped substrate layer. The VCSEL array may comprise a plurality of VCSELs on the doped substrate layer. The VCSEL array may comprise a buffer structure between the doped substrate layer and the plurality of VCSELs. The buffer structure, or a combination of the buffer structure and a layer of the plurality of VCSELs, may provide electrical isolation from the plurality of VCSELs to the doped substrate layer. The VCSEL array may comprise an isolation structure between adjacent VCSELs of the plurality of VCSELs. The isolation structure may provide electrical isolation between a first VCSEL, of the adjacent VCSELs, and a second VCSEL of the adjacent VCSELs. The first VCSEL and the second VCSEL may be different VCSELs.

24 Claims, 5 Drawing Sheets

(51) Int. Cl.

| | |
|---|---|
| *H01S 5/125* | (2006.01) |
| *H01S 5/183* | (2006.01) |
| *H01S 5/343* | (2006.01) |
| *H01S 5/042* | (2006.01) |
| *H01S 5/42* | (2006.01) |
| H01S 5/323 | (2006.01) |
| H01S 5/022 | (2006.01) |
| H01S 5/20 | (2006.01) |

(52) U.S. Cl.
CPC ............... *H01S 5/323* (2013.01); *H01S 5/343* (2013.01); *H01S 5/423* (2013.01); *H01S 2301/173* (2013.01); *H01S 2301/176* (2013.01)

(56) References Cited

U.S. PATENT DOCUMENTS

| | | |
|---|---|---|
| 8,705,585 B2 | 4/2014 | Sato et al. |
| 8,891,569 B2 | 11/2014 | Gerlach |
| 10,199,794 B1 * | 2/2019 | Yuen ..................... H01S 5/0218 |
| 2003/0218666 A1 * | 11/2003 | Holm ................... H01L 25/0753 |
| | | 347/130 |
| 2005/0286595 A1 | 12/2005 | Guenter et al. |
| 2009/0295902 A1 * | 12/2009 | Sato ........................ B82Y 20/00 |
| | | 347/224 |
| 2013/0343418 A1 * | 12/2013 | Gerlach ............. H01S 5/18341 |
| | | 372/45.01 |
| 2017/0373471 A1 * | 12/2017 | Kropp ..................... H01L 31/00 |

\* cited by examiner

ELECTRICALLY ISOLATING ADJACENT VERTICAL-EMITTING DEVICES

RELATED APPLICATION

This application is a continuation of U.S. patent application Ser. No. 15/893,068, filed Feb. 9, 2018 (now U.S. Pat. No. 10,199,794), which claims priority under 35 U.S.C. § 119 to U.S. Provisional Application No. 62/561,009, filed on Sep. 20, 2017, the contents of which are incorporated by reference herein in their entirety.

TECHNICAL FIELD

The present disclosure relates to electrical isolation of adjacent vertical-emitting devices of an emitter array and, more particularly, to use of buffer structures and isolation structures to electrically isolate the adjacent vertical-emitting devices when formed on an electrically conductive substrate.

BACKGROUND

A vertical-emitting device, such as a vertical cavity surface emitting laser (VCSEL), is a laser in which a beam is emitted in a direction perpendicular to a surface of a substrate (e.g., vertically from a surface of a semiconductor wafer). Multiple vertical-emitting devices may be arranged in an array with a common substrate.

SUMMARY

According to some possible implementations, a vertical cavity surface emitting laser (VCSEL) array may comprise a doped substrate layer. The VCSEL array may comprise a plurality of VCSELs on the doped substrate layer. The VCSEL array may comprise a buffer structure between the doped substrate layer and the plurality of VCSELs. The buffer structure, or a combination of the buffer structure and a layer of the plurality of VCSELs, may provide electrical isolation from the plurality of VCSELs to the doped substrate layer. The VCSEL array may comprise an isolation structure between adjacent VCSELs of the plurality of VCSELs. The isolation structure may provide electrical isolation between a first VCSEL, of the adjacent VCSELs, and a second VCSEL of the adjacent VCSELs. The first VCSEL and the second VCSEL may be different VCSELs.

According to some possible implementations, a method may comprise forming, on a doped substrate layer, an emitter array of vertical-emitting devices. The emitter array may include a buffer structure between the vertical-emitting devices and the doped substrate layer. The buffer structure, or a combination of the buffer structure and a layer of the vertical-emitting devices, may provide electrical isolation from the vertical-emitting devices to the doped substrate layer. The method may include forming, between adjacent vertical-emitting devices, of the vertical-emitting devices, an isolation structure. The isolation structure may provide electrical isolation between the adjacent vertical-emitting devices. The method may include forming, on the emitter array, a set of metal interconnects to electrically connect the adjacent vertical-emitting devices.

According to some possible implementations, an emitter array may comprise a doped substrate layer. The emitter array may comprise a plurality of vertical-emitting lasers on the doped substrate layer. The emitter array may comprise a buffer structure between the doped substrate layer and the plurality of vertical-emitting lasers. The buffer structure, or a combination of the buffer structure and a layer of the plurality of vertical-emitting lasers, may include multiple reverse p-n junctions to provide electrical isolation from the plurality of vertical-emitting lasers to the doped substrate layer. The emitter array may comprise an isolation structure between adjacent vertical-emitting lasers of the plurality of vertical-emitting lasers. The emitter array may comprise a trench between the adjacent vertical-emitting lasers. The isolation structure may extend from a bottom surface of the trench. The isolation structure may provide electrical isolation between the adjacent vertical-emitting lasers.

DETAILED DESCRIPTION

The following detailed description of example implementations refers to the accompanying drawings. The same reference numbers in different drawings may identify the same or similar elements.

Previously, to electrically isolate adjacent vertical-emitting devices of an emitter array, the vertical-emitting devices are formed by growing various epitaxial layers on a semi-insulating substrate. After the epitaxial layers are grown on the semi-insulating substrate, an isolation trench is etched from a surface of the emitter array into the semi-insulating substrate between adjacent vertical-emitting devices to electrically isolate the adjacent vertical-emitting devices. While this results in electrical isolation of adjacent vertical-emitting devices, use of a semi-insulating substrate may reduce a reliability of the resulting emitter array. For example, a semi-insulating substrate may be associated with a higher quantity and/or likelihood of defects, relative to other types of substrates. This reduces the quality and/or reliability of the resulting emitter array formed on the semi-insulating substrate.

Some implementations, described herein, provide an emitter array, formed on an electrically conductive substrate (e.g., a doped substrate), that includes an isolation structure between adjacent vertical-emitting devices of the emitter array to provide horizontal electrical isolation between the adjacent vertical-emitting devices. In addition, the emitter array may include a buffer structure which, alone, or in combination with one or more layers of a vertical-emitting device, provides vertical electrical isolation between the vertical-emitting device and the electrically conductive substrate. In this way, adjacent vertical-emitting devices of the emitter array may be electrically isolated despite being formed on an electrically conductive substrate. This improves a quality and/or reliability of the emitter array, relative to an emitter array formed on a semi-insulating substrate (e.g., by providing an alternative to forming vertical-emitting devices directly on a semi-insulating substrate). For example, the electrically conductive substrate may include fewer defects and/or a lower likelihood of developing defects relative to a semi-insulating substrate. In addition, this facilitates in-series powering or individual addressing of the adjacent vertical-emitting devices of the emitter array despite the adjacent vertical-emitting devices being formed on an electrically conductive substrate.

Figure 1:
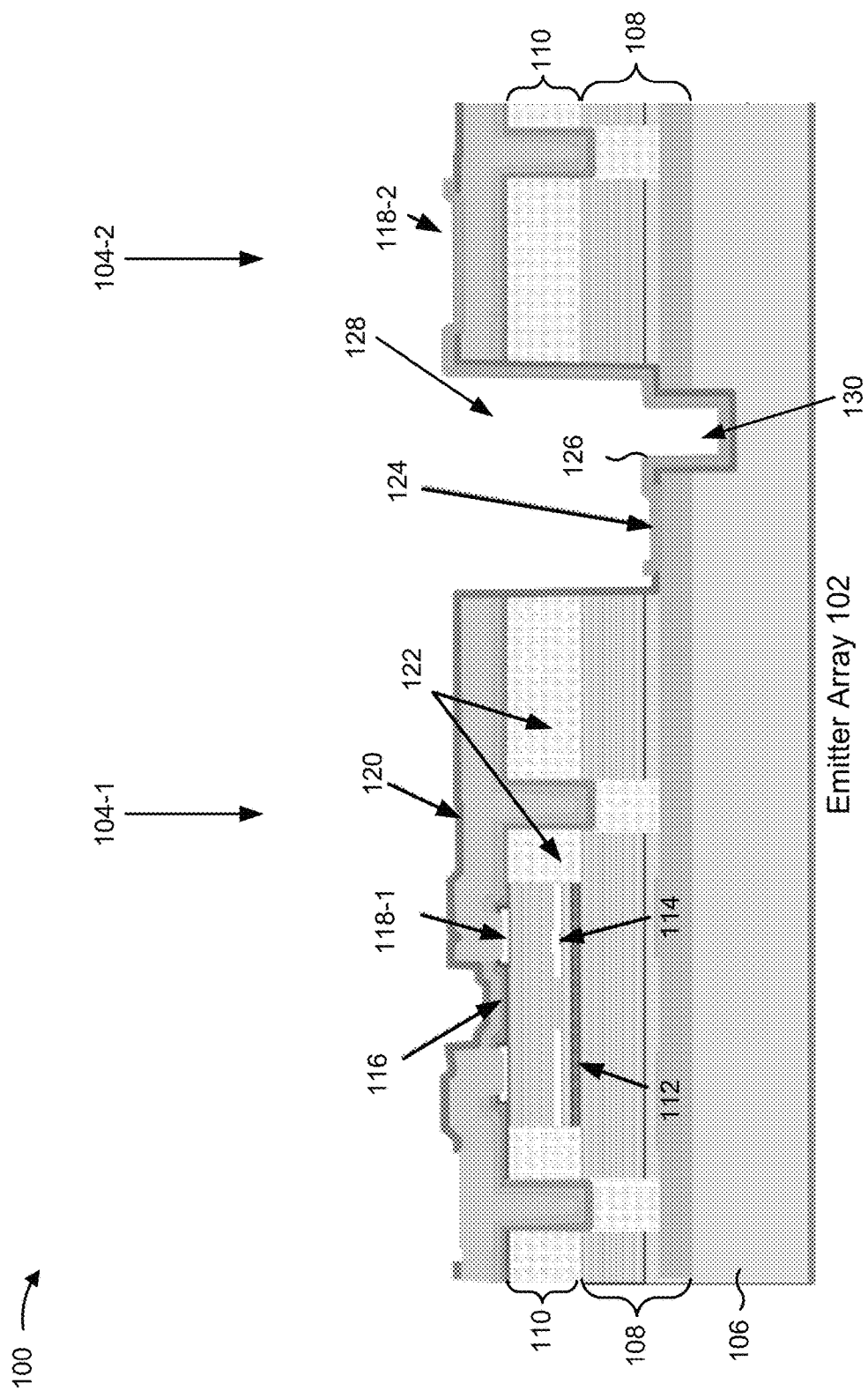
FIG. 1 is a diagram depicting a cross-sectional view of a prior emitter array that includes a trench to electrically isolate adjacent vertical-emitting devices formed on a semi-insulating substrate.

FIG. 1 is a diagram of an implementation 100 depicting a cross-sectional view of a prior emitter array that includes a trench to electrically isolate adjacent vertical-emitting devices formed on a semi-insulating substrate. FIG. 1 shows a cross-sectional view of various layers and/or structures of emitter array 102. Emitter array 102 may include multiple vertical-emitting devices. For example, FIG. 1 shows a portion of vertical-emitting device 104-1, of the multiple vertical-emitting devices, and a portion of vertical-emitting device 104-2 of the multiple vertical-emitting devices. Although some implementations will be described with respect to vertical-emitting device 104-1 or vertical-emitting device 104-2, the implementations apply equally to vertical-emitting device 104-1 and vertical-emitting device 104-2.

As further shown in FIG. 1, emitter array 102 may include semi-insulating substrate 106. For example, semi-insulating substrate 106 may be a gallium arsenide (GaAs) substrate. Additionally, or alternatively, semi-insulating substrate 106 may be un-doped, highly electrically resistive, non-conductive, poorly conductive, and/or the like. Based on semi-insulating substrate 106 being highly electrically resistive, non-conductive, poorly conductive, and/or the like, vertical-emitting devices 104-1 and 104-2 may be formed directly on semi-insulating substrate 106 without any buffering between vertical-emitting device 104-1 and 104-2. However, semi-insulating substrate 106 may include a higher quantity of defects and/or may be associated with a higher likelihood for developing defects (e.g., based on being an un-doped substrate), relative to other types of substrates, such as a doped substrate. Semi-insulating substrate 106 reduces a quality and/or reliability of emitter array 102.

As further shown in FIG. 1, emitter array 102 may include one or more n-doped epitaxial layers 108 formed on semi-insulating substrate 106. For example, the n-doped epitaxial layers 108 may include n-doped distributed Bragg reflector (n-DBR) layers and/or an N+ doped buffer layer. The n-DBR layers may include alternating layers of n-doped gallium arsenide (n-GaAs) and n-doped aluminum gallium arsenide (n-AlGaAs). The N+ doped buffer layer may only include GaAs and may be thicker than each of the alternating n-DBR layers, thereby facilitating easier etching to the N+ doped buffer layer. In addition, terminating an etch at an n-AlGaAs layer may cause problems because the aluminum in the n-AlGaAs layer can oxidize and create a poor ohmic contact. As a result, some implementations may include an N+ doped buffer layer. As further shown in FIG. 1, emitter array 102 may include one or more p-doped epitaxial layers 110 formed on the n-doped epitaxial layers 108 (e.g., p-doped distributed Bragg reflector (p-DBR) layers). P-doped epitaxial layers 110 and n-doped epitaxial layers 108 may form the mirrors of a vertical cavity of vertical-emitting device 104-1.

As further shown in FIG. 1, active layer 112 may separate portions of p-doped epitaxial layers 110 and n-doped epitaxial layers 108. For example, active layer 112 may be a layer of vertical-emitting device 104-1 where optical gain for vertical-emitting device 104-1 is generated. As further shown in FIG. 1, p-doped epitaxial layers 110 may include areas of oxidation 114 to resist electrical flow from top anode 118-1 and to guide the electrical flow through an oxidation aperture, through an active region of active layer 112 and toward n-doped epitaxial layers 108.

As further shown in FIG. 1, vertical-emitting device 104-1 may include dielectric layer 116. For example, dielectric layer 116 may include an aperture region where light is emitted from vertical-emitting device 104-1. As further shown in FIG. 1, vertical-emitting device 104-1 may include top anode 118-1. For example, top anode 118-1 may be a source of electrical flow into vertical-emitting device 104-1. Top anode 118-1 may contact the p-doped epitaxial layers 110 and may contact a portion of metal interconnect 126.

As further shown in FIG. 1, emitter array 102 may include passivation layer 120. For example, passivation layer 120 may be formed on a surface of emitter array 102 to protect or passivate the surface of emitter array 102. Additionally, or alternatively, passivation layer 120 may be formed to prevent electrical shorts of vertical-emitting device 104-1 and/or vertical-emitting device 104-2 that could be caused by metal interconnect 126 if passivation layer 120 was not present.

As further shown in FIG. 1, vertical-emitting device 104-1 may include one or more isolation regions 122 to restrict electrical flow when vertical-emitting device 104-1 is powered. For example, isolation regions 122 may be formed using an implantation technique. Continuing with the previous example, by using protons or ions, such as hydrogen ions, hydrogen protons, boron ions, oxygen ions, and/or the like, an implantation technique may damage or change an area of an epitaxial layer of vertical-emitting device 104-1. Continuing still with the previous example, the implantation technique may change or damage an area of the epitaxial layer so that the portion of the epitaxial layer is no longer electrically conductive (e.g., may form a highly electrically resistive area, a non-conductive area, a poorly conductive area. and/or the like).

As further shown in FIG. 1, vertical-emitting device 104-1 may include a top cathode 124. For example, top cathode 124 may be a point of egress for electrical flow from vertical-emitting device 104-1. Top cathode 124 may contact a portion of metal interconnect 126. This portion of metal interconnect 126 may electrically connect top cathode 124 of vertical-emitting device 104-1 and top anode 118-2 of vertical-emitting device 104-2 so that electrical current can flow from top cathode 124 of vertical-emitting device 104-1 to top anode 118-2 of vertical-emitting device 104-2. In this way, vertical-emitting device 104-1 and vertical-emitting device 104-2 may be powered in-series when emitter array 102 is powered.

Emitter array 102 may further include trench 128. For example, trench 128 may extend from a surface of emitter array 102 into n-doped epitaxial layers 108. Trench 128 may extend between vertical-emitting devices 104-1 and 104-2 (e.g., between adjacent vertical-emitting devices 104 that are to be electrically isolated). Emitter array 102 may include an additional trench between vertical-emitting devices 104-1 and 104-2, shown as trench 130. Trench 130 may extend from a bottom of trench 128 into semi-insulating substrate 106. By extending through n-doped epitaxial layers 108 and into semi-insulating substrate 106, trench 130 provides horizontal electrical isolation by preventing electrical current from flowing horizontally from vertical-emitting device 104-1 through n-doped epitaxial layers 108 and into vertical-emitting device 104-2.

Although trench 130 electrically isolates vertical-emitting device 104-1 and vertical-emitting device 104-2, trench 130 creates a more difficult surface on which to form metal interconnect 126. For example, trench 130 causes additional edges, steps, surfaces, and/or the like to be present, which increases the difficulty of forming metal interconnect 126 on the surface of trench 128 and/or trench 130. Continuing with the previous example, this increases a complexity of manufacturing emitter array 102 and/or increases a cost of manufacturing emitter array 102. In addition, the increased quantity of defects and/or likelihood for defects associated with semi-insulating substrate 106 reduces a quality of emitter array 102, decreases a reliability of emitter array 102, and/or the like. Further, by using multiple trenches (e.g., trenches 128 and 130) to provide electrical isolation between adjacent vertical-emitting devices 104-1 and 104-2, more space may be needed between vertical-emitting devices 104-1 and 104-2 to accommodate both trenches relative to an amount of space that would be need for a single trench. This may reduce a quantity of vertical-emitting devices 104 that can be included in emitter array 102 relative to another same-sized emitter array 102 that includes a single trench to electrically isolate adjacent vertical-emitting devices 104.

As indicated above, FIG. 1 is provided merely as an example. Other examples are possible and may differ from what was described with regard to FIG. 1.

Figure 2A:
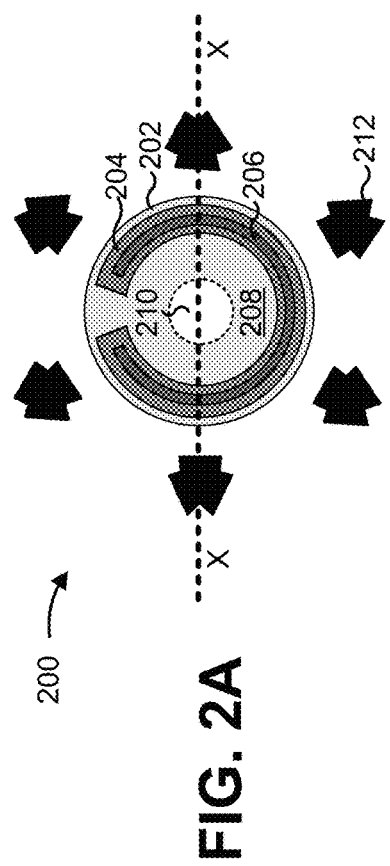
FIGS. 2A-2B are diagrams depicting a top-view of an example vertical-emitting device and an example cross-sectional view of the example vertical-emitting device, respectively.
Figure 2B:
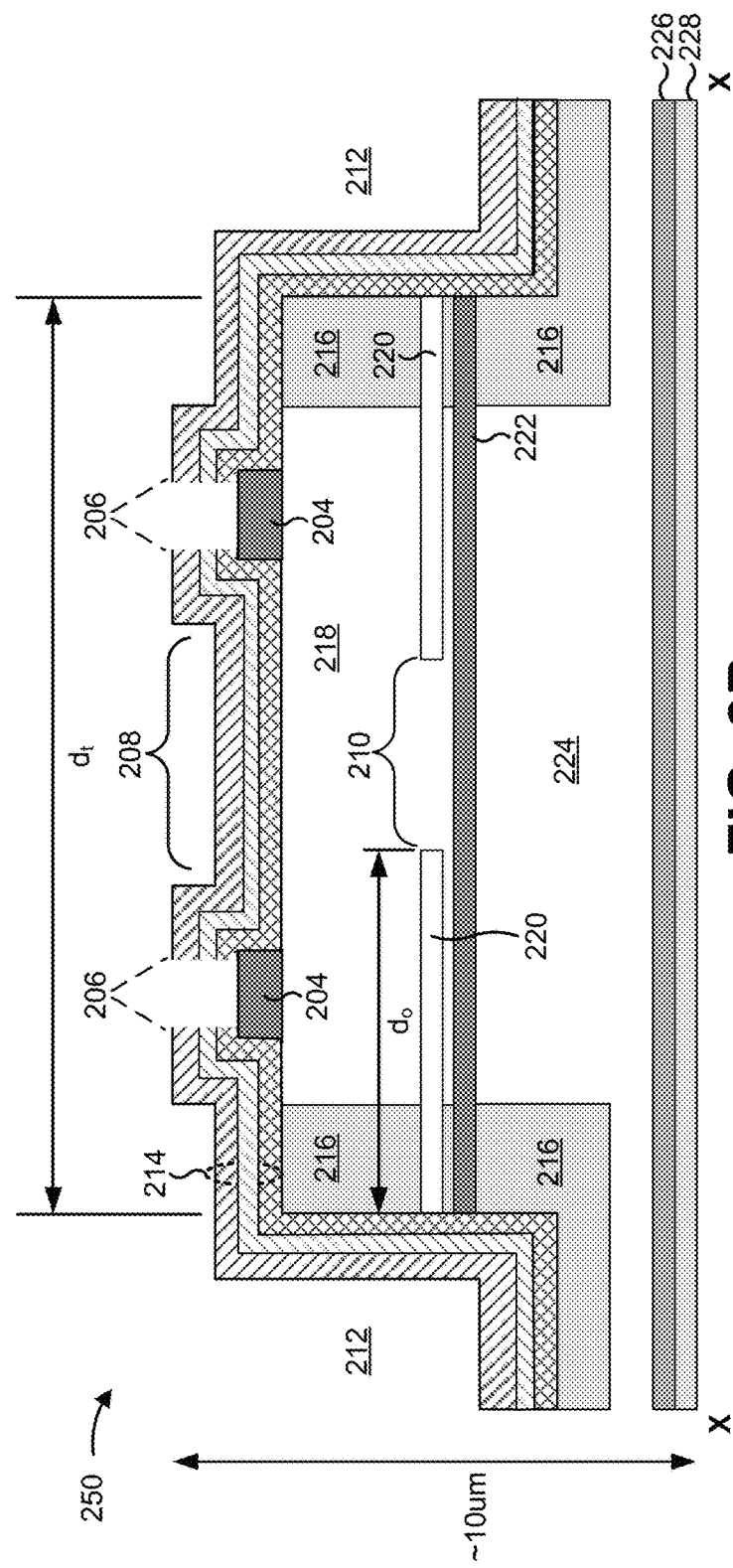

FIGS. 2A and 2B are diagrams depicting a top-view of an emitter 200 and an example cross-sectional view 250 of emitter 200, respectively. As shown in FIG. 2A, emitter 200 may include a set of emitter layers constructed in an emitter architecture. For purposes of clarity, not all emitter layers of emitter 200 are shown in FIG. 2A. In some implementations, emitter 200 may correspond to one or more vertical-emitting devices described herein.

As shown in FIG. 2A, emitter 200 includes an implant protection layer 202 that is circular in shape in this example. In some implementations, implant protection layer 202 may have another shape, such as an elliptical shape, a polygonal shape, or the like. Implant protection layer 202 is defined based on a space between sections of implant material included in emitter 200 (not shown). As shown by the medium gray area in FIG. 2A, emitter 200 includes a P-Ohmic metal layer 204 that is constructed in a partial ring-shape (e.g., with an inner radius and an outer radius). As shown, P-Ohmic metal layer 204 is positioned concentrically over implant protection layer 202 (i.e., the outer radius of P-Ohmic metal layer 204 is less than or equal to the radius of implant protection layer 202). Such configuration may be used, for example, in the case of a P-up/top-emitting emitter 200. In the case of a bottom-emitting emitter 200, the configuration may be adjusted as needed.

As further shown in FIG. 2A, emitter 200 includes a dielectric via opening 206 that is formed (e.g., etched) on a dielectric passivation/mirror layer that covers P-Ohmic metal layer 204 (not shown). As shown, dielectric via opening 206 is formed in a partial ring-shape (e.g., similar to P-Ohmic metal layer 204) and is formed concentrically over P-Ohmic metal layer 204 such that metallization of the dielectric passivation/mirror layer contacts P-Ohmic metal layer 204. In some implementations, dielectric opening 206 and/or P-Ohmic metal layer 204 may be formed in another shape, such as a full ring-shape or a split ring-shape.

As further shown, emitter 200 includes an optical aperture 208 in a portion of the emitter within the inner radius of the partial ring-shape of P-Ohmic metal layer 204. Emitter 200 emits a laser beam via optical aperture 208. As further shown, emitter 200 also includes a current confinement aperture 210 (e.g., an oxide aperture formed by an oxidation layer of emitter 200 (not shown)). Current confinement aperture 210 is formed below optical aperture 208.

As further shown in FIG. 2A, emitter 200 includes a set of oxidation trenches 212 that are spaced (e.g., equally, unequally) around a circumference of implant protection layer 202. How close oxidation trenches 212 can be positioned relative to the optical aperture 208 is dependent on the application, and is typically limited by implant protection layer 202, P-Ohmic metal layer 204, dielectric via opening 206, and manufacturing tolerances.

The number and arrangement of layers shown in FIG. 2A are provided as an example. In practice, emitter 200 may include additional layers, fewer layers, different layers, or differently arranged layers than those shown in FIG. 2A. For example, while emitter 200 includes a set of six oxidation trenches 212, in practice, other designs are possible, such as a compact emitter that includes five oxidation trenches 212, seven oxidation trenches 212, and/or the like. As another example, while emitter 200 is a circular emitter design, in practice, other designs are possible, such as a rectangular emitter, a hexagonal emitter, an elliptical emitter, or the like. Additionally, or alternatively, a set of layers (e.g., one or more layers) of emitter 200 may perform one or more functions described as being performed by another set of layers of emitter 200, respectively.

Notably, while the design of emitter 200 is described as including a VCSEL, other implementations are possible. For example, the design of emitter 200 may apply in the context of another type of optical device, such as a light emitting diode (LED), or another type of vertical emitting (e.g., top emitting or bottom emitting) optical device. Additionally, the design of emitter 200 may apply to emitters of any wavelength, power level, emission profile, or the like. In other words, emitter 200 is not particular to an emitter with a given performance characteristic.

As shown in FIG. 2B, the example cross-sectional view may represent a cross-section of emitter 200 that passes through a pair of oxidation trenches 212 (e.g., as shown by the line labeled "X-X" in FIG. 2A). As shown, emitter 200 may include a backside cathode layer 228, a substrate layer 226, a bottom mirror 224, an active region 222, an oxidation layer 220, a top mirror 218, an implant isolation material 216, a dielectric passivation/mirror layer 214, and a P-Ohmic metal layer 204. As shown, emitter 200 may have a total height that is approximately 10 11M.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, and/or the like.

Bottom mirror 224 may include a bottom reflector layer of emitter 200. For example, bottom mirror 224 may include a distributed Bragg reflector (DBR).

Active region 222 may include a layer that confines electrons and defines an emission wavelength of emitter 200. For example, active region 222 may be a quantum well.

Oxidation layer 220 may include an oxide layer that provides optical and electrical confinement of emitter 200. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed.

Current confinement aperture 210 may include an optically active aperture defined by oxidation layer 220. A size of current confinement aperture 210 may range, for example, from approximately 6.0 μm to approximately 14.0 μm. In some implementations, a size of current confinement aperture 210 may depend on a distance between oxidation trenches 212 that surround emitter 200. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as $d_o$ in FIG. 2B) toward a center of emitter 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

Top mirror 218 may include a top reflector layer of emitter 200. For example, top mirror 218 may include a DBR.

Implant isolation material 216 may include a material that provides electrical isolation. For example, implant isolation material 216 may include an ion implanted material, such as an H implanted material or a Hydrogen/Proton implanted material. In some implementations, implant isolation material 216 may define implant protection layer 202.

Dielectric passivation/mirror layer 214 may include a layer that acts as a protective passivation layer and that acts as an additional DBR. For example, dielectric passivation/mirror layer 214 may include one or more sub-layers (e.g., a $SiO_2$ layer, a $Si_3N_4$ layer) deposited (e.g., via chemical vapor deposition) on one or more other layers of emitter 200.

As shown, dielectric passivation/mirror layer 214 may include one or more dielectric via openings 206 that provide electrical access to P-Ohmic metal layer 204. Optical aperture 208 may include a portion of dielectric passivation/mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bondpad (not shown) that contacts P-Ohmic metal layer 204 through dielectric via openings 206).

In some implementations, emitter 200 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation. Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 200 may include additional layers, fewer layers, different layers, differently constructed layers, or differently arranged layers than those shown in FIG. 2B. Additionally, or alternatively, a set layers (e.g., one or more layers) of emitter 200 may perform one or more functions described as being performed by another set of layers of emitter 200.

Figure 3:
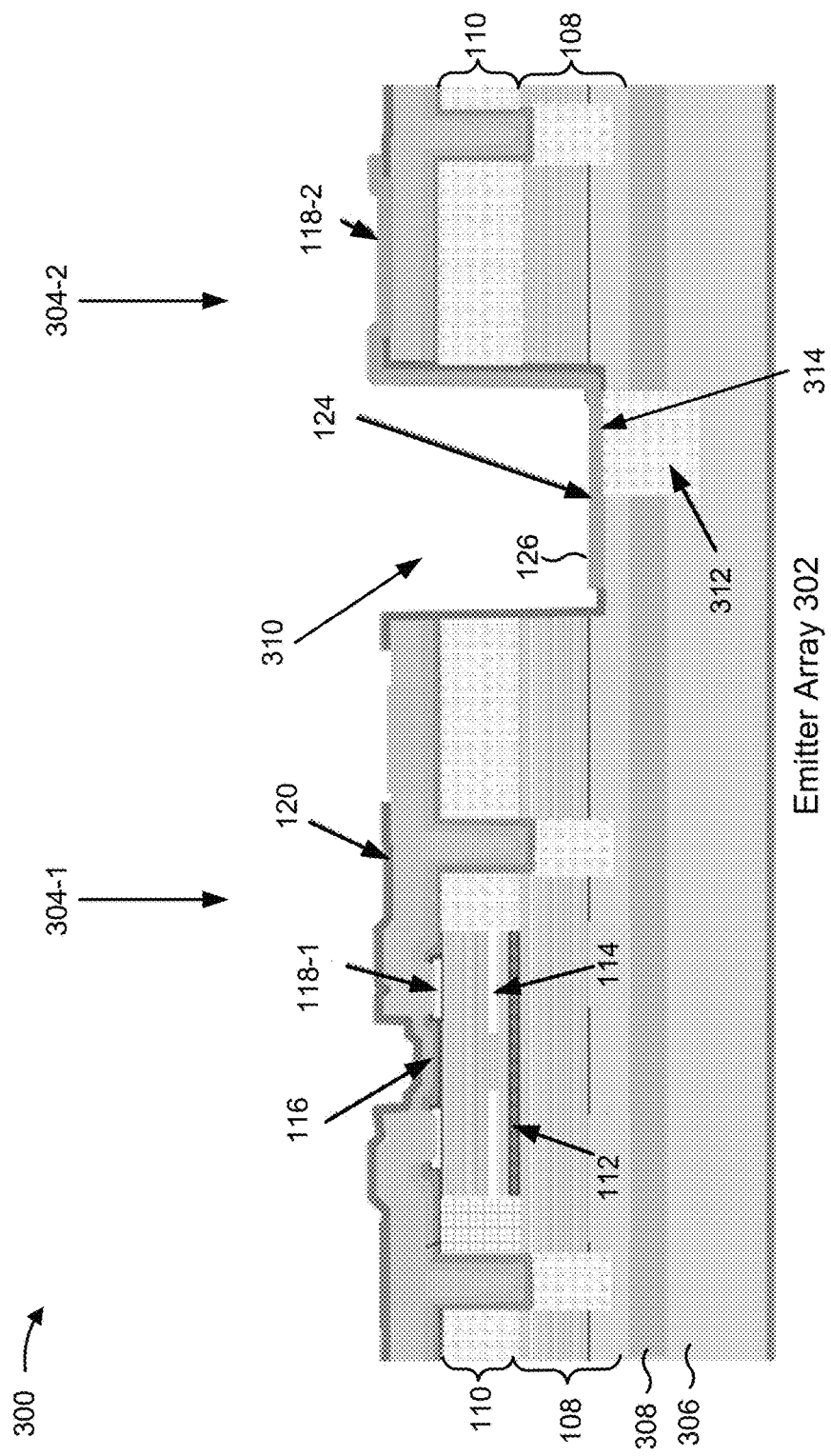
FIG. 3 is a diagram depicting a cross-sectional view of an example emitter array that includes a buffer structure and an isolation structure to electrically isolate adjacent vertical-emitting devices.

FIG. 3 is a diagram of an example implementation 300 depicting a cross-sectional view of an example emitter array 302 that includes a buffer structure and an isolation structure to electrically isolate adjacent vertical-emitting devices formed on an electrically conductive substrate. FIG. 3 shows a cross-sectional view of emitter array 302. Similar to other emitter arrays described elsewhere herein, emitter array 302 may include multiple vertical-emitting devices, shown as vertical-emitting devices 304-1 and 304-2. FIG. 3 shows portions of vertical-emitting devices 304-1 and 304-2. Although some implementations will be described with respect to vertical-emitting device 304-1 or vertical-emitting device 304-2, the implementations apply equally to both vertical-emitting device 304-1 and vertical-emitting device 304-2.

As shown in FIG. 3, emitter array 302 may include doped substrate 306 (e.g., a doped electrically conductive substrate layer). For example, doped substrate 306 may be an n-doped substrate or a p-doped substrate, such as a p-doped GaAs substrate or an n-doped GaAs substrate. Additionally, or alternatively, and as another example, doped substrate 306 may be another type of substrate, such as an indium phosphide (InP) substrate that is p or n doped. Emitter array 302 may further include p-doped epitaxial layer 308, such as a p isolation layer, as a buffer structure. For example, p-doped epitaxial layer 308 may be formed on doped substrate 306. P-doped epitaxial layer 308 may form a reverse p-n junction with n-doped epitaxial layers 108 or with another n-doped layer of the buffer structure. In this way, the buffer structure, or a combination of a buffer structure and a layer of vertical-emitting device 304, provide vertical electrical isolation from vertical-emitting device 304-1 to doped substrate 306.

In some implementations, a buffer structure may include additional reverse p-n junctions between n-doped epitaxial layers 108 and doped substrate 306. For example, there may be additional alternating p-doped layers and n-doped epitaxial layers between p-doped epitaxial layer 308 and doped substrate 306 or n-doped epitaxial layers 108. Continuing with the previous example, p-doped epitaxial layer 308 may be formed on an n-doped epitaxial layer, which may be formed on another p-doped layer, and so forth. This forms additional p-n junctions in a buffer structure between vertical-emitting devices 304 and doped substrate 306. Each additional reverse p-n junction may further reduce an amount of electrical current that leaks to doped substrate 306. Minimizing the amount of electrical current that leaks to doped substrate 306 may reduce a likelihood of a short of vertical-emitting devices 304 of emitter array 302 that could result from electrical current flowing through doped substrate 306 or may improve efficiency of the emitter array 302.

A buffer structure, or the combination of the buffer structure and layers of vertical-emitting device 304 (e.g., n-doped epitaxial layers 108 and p-doped epitaxial layers 110), may provide vertical electrical isolation of vertical-emitting device 304 from doped substrate 306. For example, a buffer structure, or the combination of the buffer structure and n-doped epitaxial layers 108 formed on the buffer structure, may restrict a vertical flow of electric current by forming at least one reverse p-n junction.

Emitter array 302 may further include trench 310 between adjacent vertical-emitting devices 304-1 and 304-2. Trench 310 may extend from a surface of emitter array 302 into n-doped epitaxial layers 108. As further shown in FIG. 3, emitter array 302 may include isolation area 312 as an isolation structure. For example, isolation area 312 may include an area of one or more layers of emitter array 302 damaged using an implantation technique (e.g., via implanting), such that the area is no longer electrically conductive. Additionally, or alternatively, isolation area 312 may include an area of one or more layers of emitter array 302 damaged by oxidation (e.g., via implanting), such that the area is no longer electrically conductive.

As shown, isolation area 312 may extend from a bottom surface of trench 310 into (e.g., down into) doped substrate 306. By extending into doped substrate 306, isolation area 312 provides horizontal electrical isolation between adjacent vertical-emitting devices 304. For example, isolation area 312 may prevent electrical current from flowing horizontally from vertical-emitting device 304-1 through n-doped epitaxial layers 108 and/or p-doped epitaxial layer 308 to vertical-emitting device 304-2. In this way, isolation area 312 causes electrical current to egress vertical-emitting device 304-1 via top cathode 124 and to flow to vertical-emitting device 304-2 via metal interconnect 126 and top anode 118-2. This facilitates in-series powering, or individual addressability, of vertical-emitting devices 304 of emitter array 302 when vertical-emitting devices 304 are formed on doped substrate 306 (rather than on semi-insulating substrate 106).

As shown by reference number 314, despite the presence of isolation area 312, a bottom surface of trench 310 has remained substantially flat as compared to the additional edges, steps, and/or the like associated with trenches 128 and 130 described above with regard to FIG. 1. This provides a surface on which metal interconnect 126 is more easily formed relative to the surface of trenches 128 and 130 and/or improves a coverage of metal interconnect 126 when formed.

In addition, by eliminating a need for two trenches to electrically isolate adjacent vertical-emitting devices 304, isolation area 312 may facilitate closer spacing of vertical-emitting devices 304 of emitter array 302 relative to emitter array 102. This may increase a quantity of vertical-emitting devices 304 that can be included in emitter array 302 relative to emitter array 102. Further, eliminating a need for two trenches may reduce a complexity and/or cost of manufacturing emitter array 302 relative to emitter array 102.

In this way, adjacent vertical-emitting devices 304 may be electrically isolated when formed on an electrically conductive substrate (e.g., doped substrate 306) using a buffer structure and an isolation structure. This facilitates in-series powering, or individual addressability, of vertical-emitting devices 304 of emitter array 302 when metal interconnect 126 is applied. In addition, by using doped substrate 306, a quality and/or reliability of emitter array 302 may be increased relative to using semi-insulating substrate 106 (e.g., due to doped substrates having a lower quantity of defects and/or a lower likelihood for developing defects relative to semi-insulating substrates).

As indicated above, FIG. 3 is provided merely as an example. Other examples are possible and may differ from what was described with regard to FIG. 3.

Figure 4:
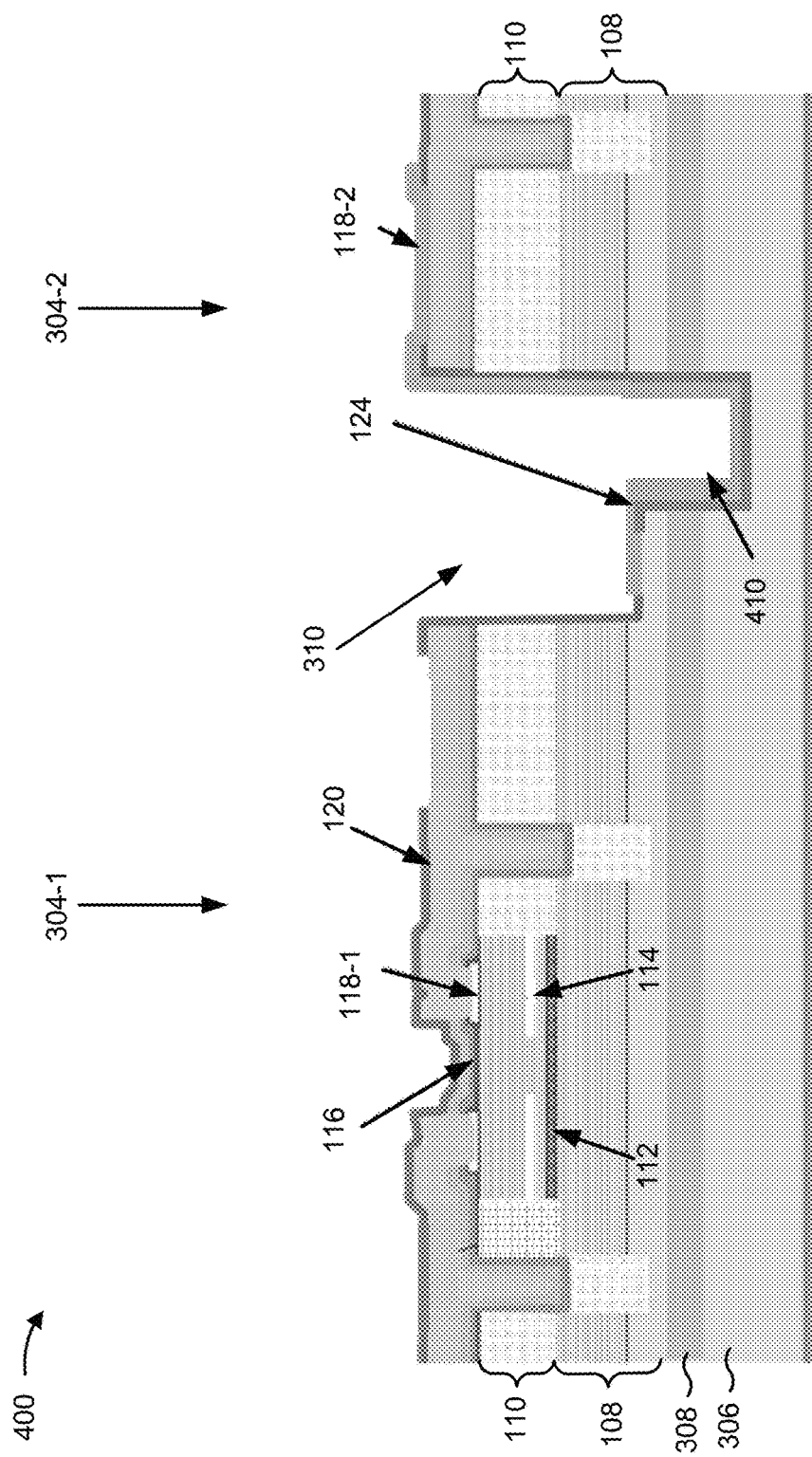
FIG. 4 is a diagram depicting a cross-sectional view of an example emitter array that includes a buffer structure and another isolation structure to electrically isolate adjacent vertical-emitting devices.

FIG. 4 shows a diagram of an example implementation 400 depicting a cross-sectional view of an example emitter array 402 that includes a buffer structure and another isolation structure to electrically isolate adjacent vertical-emitting devices formed on an electrically conductive substrate. FIG. 4 shows a cross-sectional view of emitter array 402, similar to that described above with regard to FIG. 3. Although some implementations are described with regard to vertical-emitting device 304-1 or vertical-emitting device 304-2, the implementations apply equally to both vertical-emitting device 304-1 and vertical-emitting device 304-2.

As shown in FIG. 4, emitter array 402 includes isolation trench 410 as an isolation structure (e.g., rather than including isolation area 312 as an isolation structure). For example, isolation trench 410 may extend from a bottom of trench 310 into doped substrate 306 (e.g., separating the p-doped epitaxial layers of adjacent vertical emitting devices 304-1, 304-2). In this way, isolation trench 410 provides horizontal electrical isolation of vertical-emitting device 304-1 from 304-2, in a manner similar to that described above with regard to isolation area 312. This facilitates formation of vertical-emitting devices on an electrically conductive substrate (e.g., doped substrate 306), thereby reducing a likelihood of defects in emitter array 402 and/or improving a reliability of emitter array 402 relative to emitter array 102. In some implementations, isolation trench 410 may span the same width as trench 310.

As indicated above, FIG. 4 is provided merely as an example. Other examples are possible and may differ from what was described with regard to FIG. 4.

Figure 5:
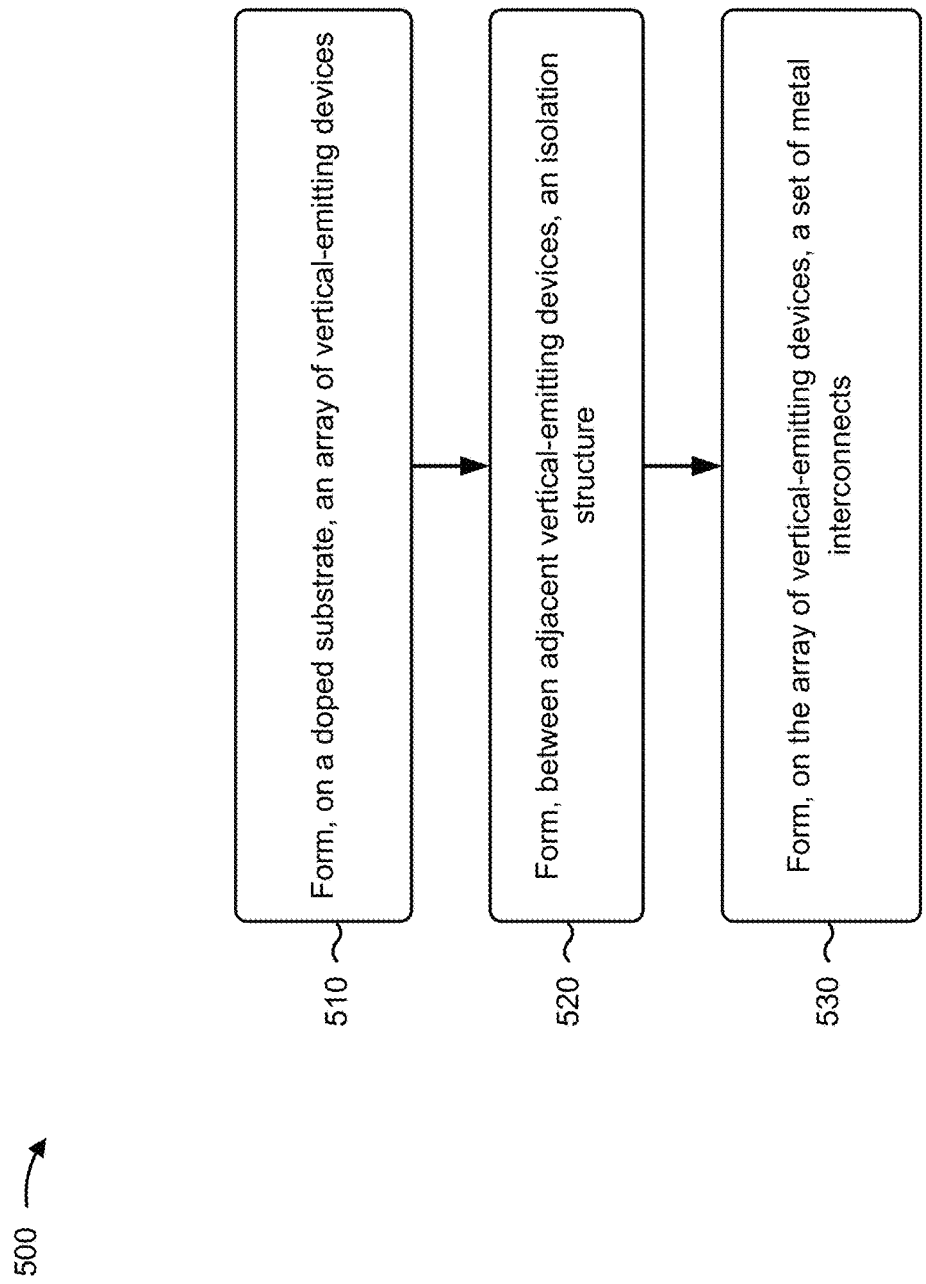
FIG. 5 is a flow chart of an example process for electrically isolating adjacent vertical-emitting devices.

FIG. 5 is a flow chart of an example process 500 for electrically isolating adjacent vertical-emitting devices, formed on an electrically conductive substrate, using a buffer structure and an isolation structure. For example, FIG. 5 shows an example process for electrically isolating vertical-emitting devices 304, formed on an electrically conductive substrate (e.g., doped substrate 306), using a buffer structure and an isolation structure.

As shown in FIG. 5, process 500 may include forming, on a doped substrate, an array of vertical-emitting devices (block 510). For example, process 500 may include forming, on doped substrate 306, an array of vertical-emitting devices 304 (e.g., emitter array 302, 402), as described above. In some implementations, doped substrate 306 may include a GaAs substrate, an InP substrate, and/or the like that has been n or p doped. Additionally, or alternatively, doped substrate 306 may be electrically conductive, may be semi-conductive, may have low electrical resistivity, and/or the like.

In some implementations, emitter array 302, 402 may include an array of vertical-emitting devices 304. For example, emitter array 302, 402 may include a vertical cavity surface emitting laser (VCSEL) array, a vertical light emitting diode (LED) array, a vertical-emitting laser array, and/or another array of vertical light emitting devices. In some implementations, vertical-emitting device 304 may include a light emitting device. For example, vertical-emitting device 304 may include a VCSEL, a vertical LED, a vertical-emitting laser, and/or the like.

In some implementations, a buffer structure may be formed on doped substrate 306 (e.g., prior to forming vertical-emitting devices 304). For example, a buffer structure may include one or more doped epitaxial layers (e.g., p-doped epitaxial layers and/or n-doped epitaxial layers).

Continuing with the previous example, p-doped epitaxial layer 308 may be formed on doped substrate 306 to form a buffer structure. In some implementations, a buffer structure that includes multiple doped epitaxial layers may include one or more reverse p-n junctions. For example, alternating p-doped epitaxial layers and n-doped epitaxial layers may be formed on doped substrate 306 to form a buffer structure that includes one or more reverse p-n junctions.

In some implementations, sets of epitaxial layers may be formed on the buffer structure to form vertical-emitting devices 304. For example, alternating sets of p-doped epitaxial layers 110 and n-doped epitaxial layers 108 may be formed on the buffer structure. In some implementations, the alternating sets of p-doped epitaxial layers 110 and n-doped epitaxial layers 108 may form additional reverse p-n junctions. Additionally, or alternatively, the sets of epitaxial layers may form a reverse p-n junction with the buffer structure. For example, if the top layer of the buffer structure is p-doped epitaxial layer 308, then the epitaxial layer, of vertical-emitting device 304, formed on p-doped epitaxial layer 308 may be one of n-doped epitaxial layers 108. In this way, a buffer structure, or the combination of the buffer structure and vertical-emitting device 304, may include multiple reverse p-n junctions. In addition, in this way, the buffer structure, or the combination of the buffer structure and the epitaxial layers of vertical-emitting device 304, may provide vertical electrical isolation of vertical-emitting device 304 from doped substrate 306.

In some implementations, trench 310 may be formed (e.g., etched) into emitter array 302, 402. For example, trench 310 may be etched between adjacent vertical-emitting devices 304 that are to be electrically isolated (e.g., that are to be horizontally electrically isolated so portions of metal interconnect 126 can connected adjacent vertical-emitting devices 304 in series, or independently, instead of being connected in parallel). In some implementations, trench 310 may be formed from a surface of emitter array 302, 402 using an etching technique (e.g., a wet etching technique or a dry etching technique). For example, trench 310 may be etched from a surface of emitter array 302, 402 into n-doped epitaxial layers 108. In some implementations, passivation layer 120 and/or dielectric layer 116 may be formed on emitter array 302, 402. For example, passivation layer 120 and/or dielectric layer 116 may be formed after trench 310 has been formed. In some implementations, passivation layer 120 and/or dielectric layer 116 may be formed after an isolation structure (described below) has been formed in emitter array 302, 402. In some implementations, dielectric layer 116 and/or passivation layer 120 may provide electrical isolation between metal interconnects 126 and vertical-emitting device 304. For example, dielectric layer 116 may include dielectric DBR layers (e.g., that form a reflective layer) and passivation layer 120 may passivate sidewalls of trenches or other features of vertical-emitting device 304, emitter array 302, and/or emitter array 402.

In this way, process 500 includes forming, on doped substrate 306, an array of vertical-emitting devices 304 prior to forming an isolation structure in emitter array 302, 402.

As further shown in FIG. 5, process 500 may include forming, between adjacent vertical-emitting devices, an isolation structure (block 520). For example, process 500 may include forming, between adjacent vertical-emitting devices 304, an isolation structure, as described above.

In some implementations, an isolation structure may include isolation area 312 between adjacent vertical-emitting devices 304. For example, an isolation structure may include an area of emitter array 302 (e.g., an area of one or more layers of vertical-emitting device 304 and/or an area of doped substrate 306) that has been changed or damaged (e.g., via implanting) using an implantation technique (e.g., an ion implantation technique or a proton implantation technique), such that the area is no longer electrically conductive and thereby provides horizontal electrical isolation between adjacent vertical-emitting devices 304. Additionally, or alternatively, and as another example, isolation area 312 may include an area of oxidation. In some implementations, isolation area 312 may be formed after trench 310 has been formed. For example, isolation area 312 may be formed from a bottom surface of trench 310 into doped substrate 306.

Additionally, or alternatively, an isolation structure may include isolation trench 410 (e.g., that extends between adjacent vertical-emitting devices 304). For example, after trench 310 has been formed, isolation trench 410 may be formed from a bottom of trench 310 into doped substrate 306 (e.g., a doped substrate layer), such that isolation trench 410 provides horizontal electrical isolation between adjacent vertical-emitting devices 304.

In this way, process 500 may include forming, between adjacent vertical-emitting devices 304, an isolation structure prior to forming, on emitter array 302, 402, a set of metal interconnects 126.

As further shown in FIG. 5, process 500 may include forming, on the array of vertical-emitting devices, a set of metal interconnects (block 530). For example, process 500 may include forming, on an emitter array 302, 402, a set of metal interconnects 126, as described above. In some implementations, metal interconnect 126 may be formed on passivation layer 120, on dielectric layer 116, on an isolation structure, and/or the like.

In some implementations, metal interconnect 126 may be formed such that metal interconnect 126 electrically connects a first vertical-emitting device 304 and a second vertical-emitting device 304. For example, a first portion of metal interconnect 126 may be formed connected to top anode 118-1 of the first vertical-emitting device 304 (e.g., to connect to an anode pad on a die) and a second, electrically separate, portion of metal interconnect 126 may be formed from top cathode 124 of the first vertical-emitting device 304 to top anode 118 of the second vertical-emitting device 304 (e.g., on trench 310, on the isolation structure, on passivation layer 120, on dielectric layer 116, etc.). In this way, a portion of metal interconnect 126 may electrically connect two adjacent vertical-emitting devices 304 in series. In some example implementations, other configurations of metal interconnect 126 are possible such that vertical-emitting device 304-1 and vertical-emitting device 304-2 are electrically disconnected or separately addressable.

In this way, process 500 includes forming, on emitter array 302, 402, a set of metal interconnects 126.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Some implementations, described herein, provide emitter array 302, 402, formed on doped substrate 306, with an isolation structure between adjacent vertical-emitting devices 304 of emitter array 302, 402. This electrically isolates the adjacent vertical-emitting devices 304 so metal interconnect 126 can connect the adjacent vertical-emitting devices 304 to be powered in series, despite being formed on an electrically conductive substrate. In addition, a quality and/or a reliability of emitter array 302, 402 may be improved via use of a substrate that is associated with a lower likelihood of including defects than other types of substrates, such as semi-insulating substrate 106. Furthermore, a size of emitter array 302, 402 and/or a spacing between adjacent vertical-emitting devices 304, may be reduced, thereby decreasing the size and/or cost of emitter array 302, 402 and/or increasing the density of vertical-emitting devices 304 on emitter array 302, 402.

The number, arrangement, thicknesses, order, symmetry, and/or the like, of layers shown in the figures and/or described herein are provided as examples. In practice, emitter arrays and/or vertical-emitting devices shown in the figures and/or described herein may include additional layers, fewer layers, different layers, differently constructed layers, or differently arranged layers than those shown in the figures and/or described herein. Additionally, or alternatively, a set layers (e.g., one or more layers) of an emitter array and/or a vertical-emitting device may perform one or more functions described as being performed by another set of layers of the emitter array and/or the vertical-emitting device.

Although some implementations were described with respect to particular vertical-emitting devices (e.g., vertical-emitting device 104-1, vertical-emitting device 304-1, etc.), the implementations apply equally to other vertical-emitting devices (e.g., vertical-emitting device 104-2, vertical-emitting device 304-2, etc.).

The foregoing disclosure provides illustration and description, but is not intended to be exhaustive or to limit the implementations to the precise form disclosed. Modifications and variations are possible in light of the above disclosure or may be acquired from practice of the implementations.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An optical device comprising:
    a doped substrate layer;
    a plurality of a vertical cavity surface emitting laser (VCSEL) arrays on the doped substrate layer;
    a buffer structure, between the doped substrate layer and the plurality of VCSEL arrays, to provide electrical isolation from the plurality of VCSEL arrays to the doped substrate layer; and
    an isolation structure between adjacent VCSEL arrays of the plurality of VCSEL arrays and extending through the buffer structure into the doped substrate layer.

2. The optical device of claim 1, further comprising:
    a metal interconnect to electrically connect at least two adjacent VCSEL arrays, of the plurality of VCSEL arrays, in series.

3. The optical device of claim 2, where the metal interconnect electrically connects each VCSEL array, of the plurality of VCSEL arrays, in series.

4. The optical device of claim 1, further comprising:
    a trench between a first VCSEL array, of the plurality of VCSEL arrays, and a second VCSEL array of the plurality of VCSEL arrays,
        wherein the isolation structure extends from a bottom of the trench.

5. The optical device of claim 1, wherein the buffer structure forms a reverse p-n junction with a layer of each VCSEL array of the plurality of VCSEL arrays.

6. The optical device of claim 1, wherein layers of each VCSEL array, of the plurality of VCSEL arrays, form at least one reverse p-n junction and form a reverse p-n junction with the buffer structure.

7. The optical device of claim 1, wherein the isolation structure is an isolation area.

8. The optical device of claim 1, wherein the isolation structure is an isolation trench.

9. The optical device of claim 1, wherein the buffer structure includes multiple epitaxial layers that form at least one reverse p-n junction within the buffer structure.

10. A method, comprising:
    forming, on a doped substrate layer, a plurality of emitter arrays of vertical-emitting devices,
        wherein a buffer structure is located between the doped substrate layer and the plurality of emitter arrays, and
        wherein the buffer structure provides electrical isolation from the plurality of emitter arrays to the doped substrate layer; and
    forming, between adjacent emitter arrays of the plurality of emitter arrays, an isolation structure,
        wherein the isolation structure extends through the buffer structure into the doped substrate layer.

11. The method of claim 10, wherein forming the isolation structure includes:
    forming a trench between the adjacent emitter arrays,
        wherein the isolation structure extends from a bottom of the trench.

12. The method of claim 10, wherein the isolation structure is an isolation area.

13. The method of claim 10, wherein the isolation structure is an isolation trench.

14. The method of claim 10, further comprising:
    forming a metal interconnect to electrically connect at least two adjacent emitter arrays, of the plurality of emitter arrays, in series.

15. The method of claim 14, further comprising:
    forming a passivation layer on each emitter array, of the plurality of emitter arrays, after forming the isolation structure,
    wherein forming the metal interconnect comprises:
        forming the metal interconnect on the passivation layer after forming the passivation layer.

16. The method of claim 10, wherein forming the plurality of emitter arrays comprises:
    forming, on the doped substrate layer, the buffer structure; and forming, on the buffer structure, layers of the vertical-emitting devices, wherein a combination of the layers and the buffer structure includes at least one p-n junction.

17. An emitter array, comprising:

a doped substrate layer;

a plurality of vertical-emitting lasers on the doped substrate layer;

a buffer structure between the doped substrate layer and the plurality of vertical-emitting lasers, to provide electrical isolation from the emitter array to the doped substrate layer; and an isolation structure between adjacent vertical-emitting lasers of the plurality of vertical-emitting lasers and extending through the buffer structure into the doped substrate layer.

18. The emitter array of claim 17, further comprising:

a metal interconnect to electrically connect at least two adjacent vertical-emitting lasers, of the plurality of vertical-emitting lasers, in series.

19. The emitter array of claim 17, further comprising:

a trench between a first vertical-emitting laser, of the plurality of vertical-emitting lasers, and a second vertical-emitting laser of the plurality of vertical-emitting lasers, wherein the isolation structure extends from a bottom of the trench.

20. The emitter array of claim 17, wherein the buffer structure forms a reverse p-n junction with a layer of vertical-emitting laser of the plurality of vertical-emitting lasers.

21. The emitter array of claim 17, wherein layers of each vertical-emitting laser, of the plurality of vertical-emitting lasers, form at least one reverse p-n junction and form a reverse p-n junction with the buffer structure.

22. The emitter array of claim 17, wherein the isolation structure is an isolation area.

23. The emitter array of claim 17, wherein the isolation structure is an isolation trench.

24. The emitter array of claim 17, wherein the buffer structure includes multiple epitaxial layers that form at least one reverse p-n junction within the buffer structure.

* * * * *